US006275433B1

(12) United States Patent
Forbes

(10) Patent No.: US 6,275,433 B1
(45) Date of Patent: Aug. 14, 2001

(54) FOUR TRANSISTOR SRAM CELL WITH IMPROVED READ ACCESS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/651,632

(22) Filed: Aug. 30, 2000

(51) Int. Cl.[7] ....................................... G11C 7/00
(52) U.S. Cl. .................... 365/205; 365/203; 365/207; 365/230.06
(58) Field of Search .................................. 365/205, 203, 365/207, 208, 230.06, 233

(56) References Cited

U.S. PATENT DOCUMENTS

| | | | |
|---|---|---|---|
| 5,841,717 | * 11/1998 | Yamaguchi | 365/205 |
| 6,011,726 | 1/2000 | Batson et al. | 365/188 |

OTHER PUBLICATIONS

Lage et al., "Advanced SRAM technology—the rate between 4T and 6T cells," Abstract, Technical Digest—Proceedings of the 1996 IEEE International Electron Devices Meeting Dec. 8–11, 1996.

* cited by examiner

*Primary Examiner*—David Nelms
*Assistant Examiner*—David Lam
(74) *Attorney, Agent, or Firm*—Williams, Morgan & Amerson, P.C.

(57) ABSTRACT

A memory cell comprises first and second output nodes, a first transistor coupled between a first power supply node and the first output node, a first load coupled between the first output node and a second power supply node, a second load coupled between the first power supply node and the second output node, and a second transistor coupled between the second output node and the second power supply node. A gate terminal of the first transistor is coupled to the second output node, and a gate terminal of the second transistor is coupled to the first output node.

28 Claims, 5 Drawing Sheets

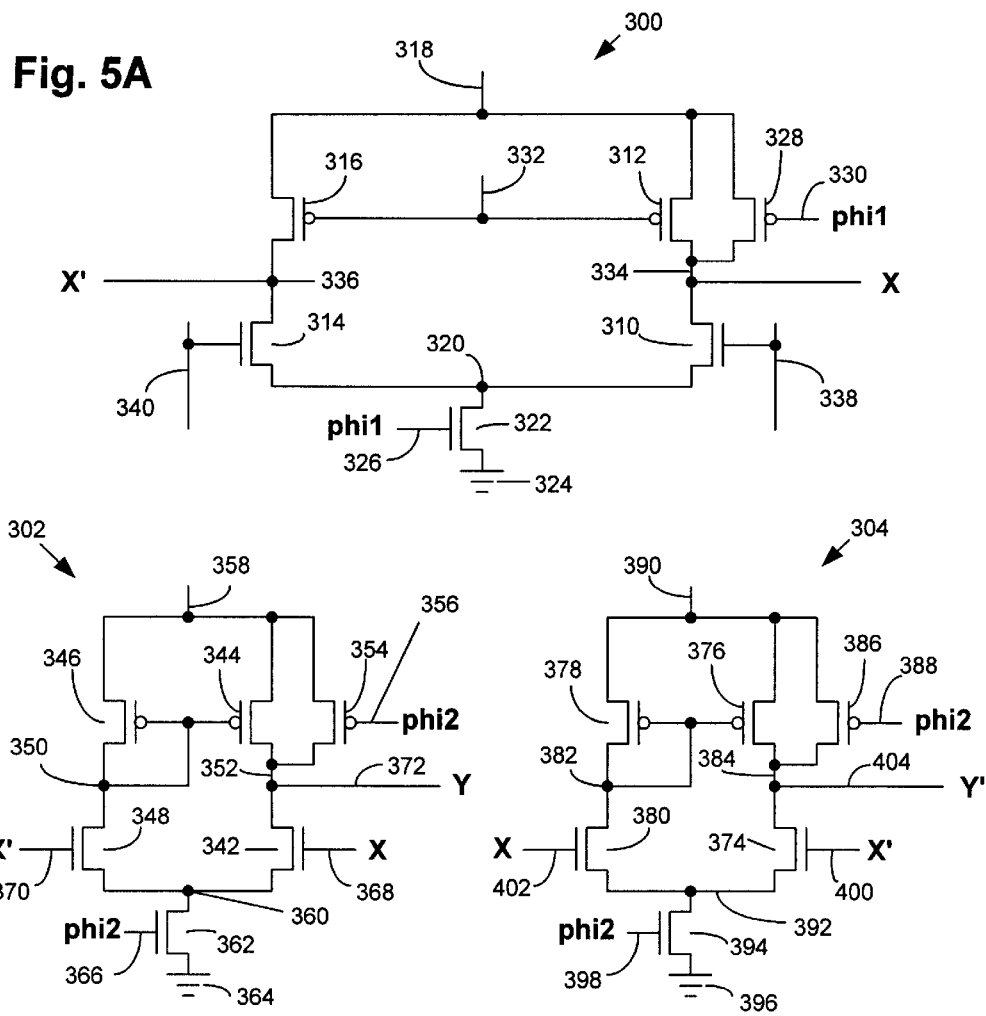
Fig. 5A
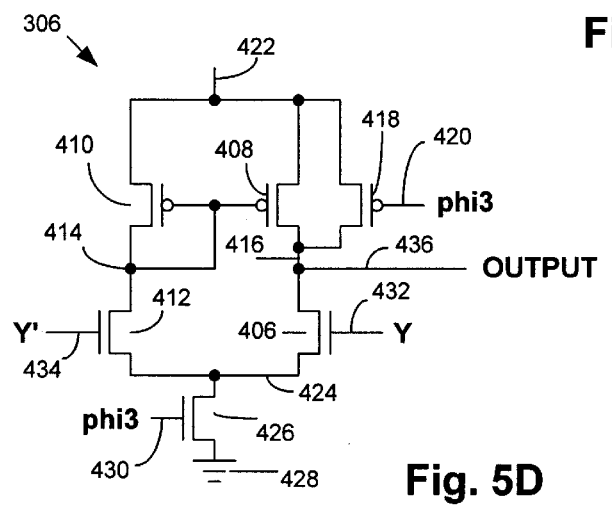
Fig. 5B
Fig. 5C
Fig. 5D

FOUR TRANSISTOR SRAM CELL WITH IMPROVED READ ACCESS

BACKGROUND OF THE INVENTION

1. Field of the Invention

The present invention relates generally to semiconductor memory devices, and, more particularly, to a static random access memory (SRAM) cell and sensing circuitry yielding an improved read access time.

2. Description of the Related Art

In many computer systems, high speed redundant memories are commonly used to store recently used data or data that will likely be needed very soon. These memories are referred to as cache memories. A cache memory mirrors data stored in the main memory of the computer system, but because of its significantly higher speed, the cache memory may supply data more quickly. Typically, dynamic random access memories (DRAMs) are used as main memory devices due to their relatively high densities. Cache memories are typically static random access memories (SRAMs). SRAMs generally have lower densities than DRAMs, but they are significantly faster. Because of their higher speeds of operation, SRAMs find additional application in various computer systems, and their use as cache memories is simply one example of their application.

Various configurations of SRAM memory cells have been designed and developed to reduce the silicon area consumed by the cells, to increase the operating speed of the devices, and to achieve numerous other goals. Traditionally, SRAMs have been designed with either four transistors and two polysilicon load resistors, or six transistors, using two PMOS devices as active load devices. Reduction of silicon area consumed by an SRAM cell, i.e., increasing the density of cells in an SRAM device, can be realized by using cells with as few transistors as possible. In many stand-alone SRAM applications, polysilicon load resistors have replaced the PMOS load transistors in the six-transistor cells. Resistive load inverters, however, have very asymmetrical switching transients and have steady-state standby DC power dissipation. Accordingly, many SRAMs embedded in microprocessors have continued to use the six-transistor cells. Other SRAM designs have also been proposed. For example, U.S. Pat. No. 6,011,726, issued Jan. 4, 2000, entitled "Four Device SRAM Cell With Single Bit Line," describes a cell having four transistors and one polysilicon load resistor. Other approaches have used only four transistors and have relied upon the sub-threshold leakage of the transfer devices in place of load resistors or transistors. These types of cells have been referred to as "loadless" four-transistor CMOS SRAM cells with no polysilicon resistor.

FIG. 1 illustrates a conventional CMOS SRAM cell 10 in combination with a cross-coupled sense amplifier 20. The cell 10 is coupled to the sense amplifier 20 by way of a bit line 58 and a complementary bit line 60. The cell 10 includes two NMOS transistors 32, 34 and two resistors 36, 38. The transistor 32 and the resistor 36 are coupled in series between a power supply voltage 42 and a ground potential 44. The transistor 34 and the resistor 38 are also coupled in series between the power supply voltage 42 and the ground potential 44. The gate terminal of the transistor 32 is coupled to a node 48 between the transistor 34 and the resistor 38, and the gate terminal of the transistor 34 is coupled to a node 46 between the transistor 32 and the resistor 36. An access transistor 52 couples the node 46 of the cell 10 to the complementary bit line 60, and an access transistor 54 couples the node 48 of the cell 10 to the bit line 58. An access signal will be provided on line 56 when the cell 10 is to be coupled to the bit line 58 and the complementary bit line 60 so that a datum stored in the cell 10 may be read by way of the sense amplifier 20. The cell 10 is a symmetrical SRAM cell.

The sense amplifier 20 includes two NMOS transistors 62, 64 and two PMOS transistors 66, 68. The transistor 62 and the transistor 66 are coupled in series between a power supply voltage 42 and a ground potential 44, and the transistor 64 and the transistor 68 are coupled in series between the power supply voltage 42 and the ground potential 44. The gate of the transistor 62 is coupled to a node 72 between the transistors 64 and 68, while the gate of the transistor 64 is coupled to a node 70 between the transistors 62 and 66. The node 72 of the sense amplifier 20 is coupled to the bit line 58, while the node 70 of the sense amplifier 20 is coupled to the complementary bit line 60. When the datum in the cell 10 is to be read, the bit line 58 and the complementary bit line 60 are each pre-charged to a value of approximately one-half the full power supply voltage, or VDD/2. A datum is represented by one of two possible states in which the cell 10 may be maintained. For example, a logical "zero" may be represented in the cell 10 when the node 46 is at or near the ground potential and the node 48 is at or near the power supply potential. A logical "one" might be indicated by the node 48 being at or close to the ground potential and the node 46 being at or close to the power supply potential.

For purposes of explanation, assume the cell 10 stores a logical "one," meaning the node 48 is at or near the ground potential and the node 46 is at or near the power supply potential. Because the cell 10 is symmetrical, sensing a logical "one" or logical "zero" will require the same amount of time. After the bit line 58 and the complementary bit line 60 have been pre-charged to approximately one-half the power supply potential (by circuitry not shown), an access signal is provided on the line 56 to turn on the access transistors 52 and 54 to couple the nodes 46 and 48 to the complementary bit line 60 and the bit line 58, respectively. Because the node 48 is at a low potential, the transistor 32 is in an "off," or non-conducting, state, and because the node 46 is at a high potential, the transistor 34 is in its "on," or conducting, state. When the nodes 46 and 48 are coupled to the complementary bit line 60 and the bit line 58, respectively, the conducting transistor 34 will begin to pull the potential on the bit line 58 toward the ground potential. Conversely, because the transistor 32 remains in a non-conducting, or essentially non-conducting, state, the potential on the complementary bit line 60 is pulled up toward the power supply potential through the resistor 36. As a differential voltage appears between the bit line 58 and the complementary bit line 60, the sense amplifier 20 will amplify the difference and drive the bit line 58 to ground potential and the complementary bit line 60 to the power supply potential. Output circuitry (not shown) will utilize the potential on the bit line 58 or the potential on the complementary bit line 60, or both, to produce an output signal indicative of the datum stored in the cell 10.

FIG. 2 illustrates a read operation on a conventional SRAM cell 100 using single-sided sensing when the bit lines are pre-charged to a high potential (rather than VDD/2). The cell 100 in FIG. 2 is identical to the cell 10 in FIG. 1. But, the cell 10 in FIG. 1 is coupled to a two-input sensing amplifier, whereas the sensing amplifier in FIG. 2 is single-sided. Depending on the state of the memory cell 100, either transistor 102 or transistor 104 will be conducting while the other is not conducting. When a transfer device (e.g., transistor 118) is activated to read the cell 100, the bit line is initially at a high potential, and if the transistor 104 in the cell is in a conducting state, it pulls the bit line toward ground potential. In the example of FIG. 2, the signal on the line 126 to the sense amplifier is in reality only single-sided, or single-ended. The signal is not differential and, as such, is more susceptible to common mode noise.

The present invention is directed to memory cells, as well as sensing and output circuitry, that provide ever-decreasing read access times while achieving greater stability and reliability in operation.

SUMMARY OF THE INVENTION

In one aspect of the present invention, a memory cell comprises first and second output nodes, a first transistor coupled between a first power supply node and the first output node, a first load coupled between the first output node and a second power supply node, a second load coupled between the first power supply node and the second output node, and a second transistor coupled between the second output node and the second power supply node. A gate terminal of the first transistor is coupled to the second output node, and a gate terminal of the second transistor is coupled to the first output node.

In another aspect of the present invention, a sense amplifier comprises first and second output nodes, a first transistor coupled between a first power supply node and the first output node, a second transistor coupled between the first output node and a second power supply node, the second transistor having a gate terminal coupled to a first bit line, a third transistor coupled between the first power supply node and the second output node, a fourth transistor coupled between the first power supply node and the second output node, the fourth transistor having a gate terminal coupled to a clock signal line, and a fifth transistor coupled between the second output node and the second power supply node, the fifth transistor having a gate terminal coupled to a second bit line. The sense amplifier is adapted to provide first and second output signals at the first and second output nodes, respectively, in response to signals on the first and second bit lines and a clock signal on the clock signal line.

In yet another aspect of the present invention, a sense amplifier comprises first and second output nodes, a first load coupled between a first power supply node and the first output node, a second load coupled between the first power supply node and the second output node, a first input transistor coupled between the first output node and a second power supply node, the first input transistor having a gate terminal coupled to a first bit line, a second input transistor coupled between the second output node and the second power supply node, the second input transistor having a gate terminal coupled to a second bit line, and a pre-charge transistor coupled between the first power supply node and the second output node, the pre-charge transistor having a gate terminal coupled to a clock signal line, the pre-charge transistor adapted to couple the second output node to the first power supply node during a first phase of a clock signal on the clock signal line.

In yet another aspect of the present invention, a memory cell sense circuit comprises a sense amplifier coupled to first and second bit lines and having first and second sense amplifier output nodes, a first driver circuit coupled to the first and second sense amplifier output nodes and having a first driver output node, a second driver circuit coupled to the first and second sense amplifier output nodes and having a second driver output node, and an output driver circuit coupled to the first and second driver output nodes and having an output driver output node. The sense amplifier includes a pre-charge transistor coupled to the second sense amplifier output node and adapted to pre-charge the second sense amplifier output node to approximately a first power supply potential. Each of the first driver circuit, the second driver circuit, and the output driver circuit has a pre-charge transistor coupled to its respective output node and adapted to pre-charge its respective output node to approximately the first power supply potential.

BRIEF DESCRIPTION OF THE DRAWINGS

The invention may be understood by reference to the following description, taken in conjunction with the accompanying drawings, in which like reference numerals identify like elements, and in which:

FIGS. 5A–5D are schematic diagram of one illustrative embodiment of a sense amplifier and output circuitry embodying the present invention.

Figure 1:
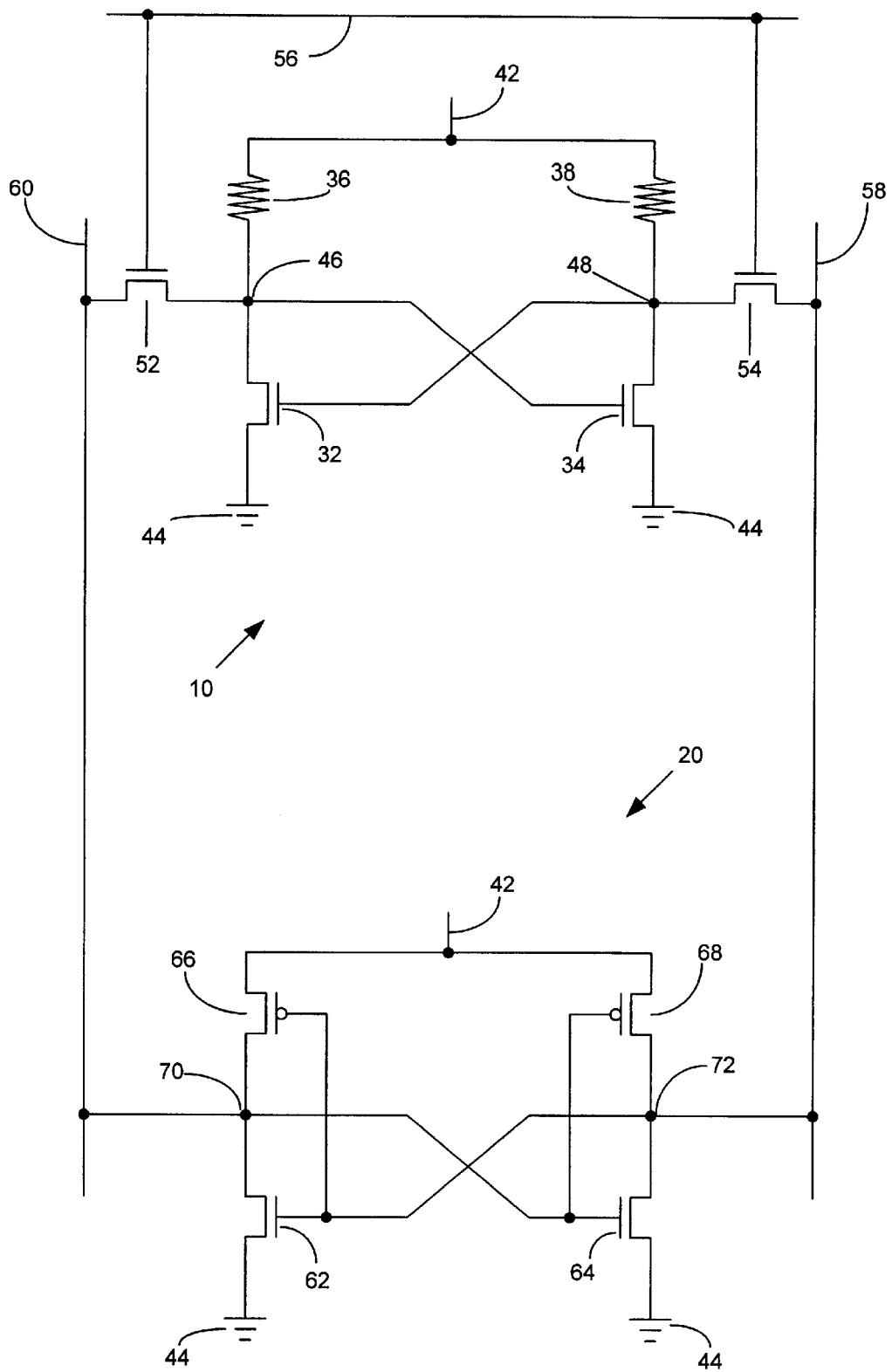
FIG. 1 illustrates a conventional CMOS SRAM cell in combination with a cross-coupled sense amplifier.
Figure 2:
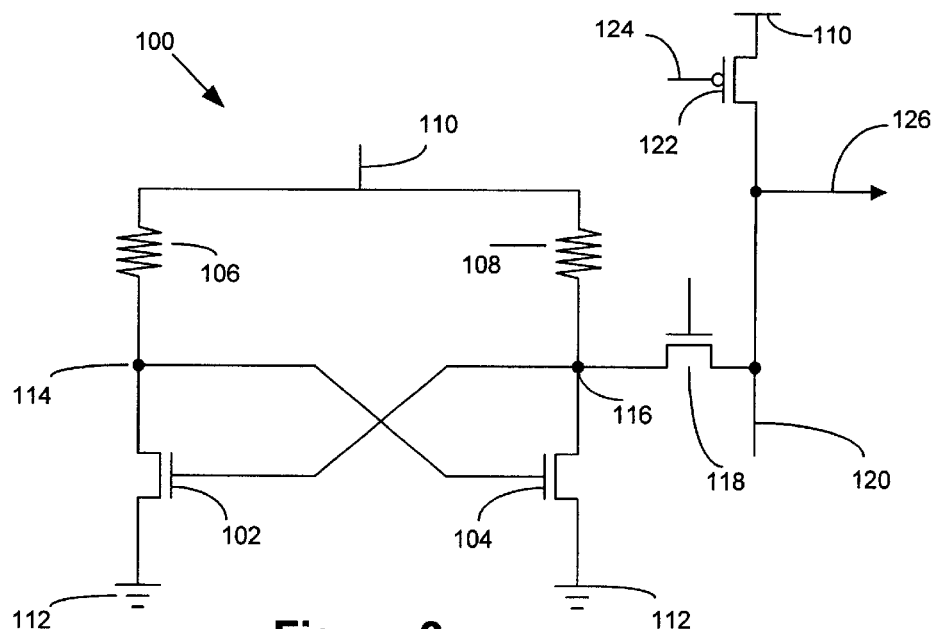
FIG. 2 illustrates a conventional SRAM cell as used in a single-sided sensing arrangement.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 3–6. In general, the present invention is directed to a new SRAM cell and new sensing and output circuitry for improved access times in reading memory cells. The illustrative embodiments shown in the FIGS. 3–5 and described herein utilize n-channel and p-channel transistors in particular arrangements in their specific SRAM cells and sensing and output circuitry. However, as will be readily apparent to those skilled in the art upon a complete reading of the present application, the present invention is applicable to a variety of technologies, e.g., NMOS, PMOS, CMOS, etc., and the memory cell and sensing and output circuitry of the present invention may be realized using a variety of transistors and devices in other forms and/or arrangements. Further, the present invention will find application in a wide variety of integrated circuit devices, including, but not limited to, microprocessors, logic devices, memory devices, etc. Accordingly, the attached drawings and description herein are intended only to describe and explain illustrative examples of the present invention.

The illustrative embodiment of a memory cell described herein may be realized using various semiconductor manufacturing technologies. In particular, the memory cell may be realized using SOI technology. In SOI technology, PMOS devices and NMOS devices may be made with equal ease, as neither requires a separate substrate well, as in common in CMOS technology. Moreover, in SOI technology, as devices are scaled to deep submicron dimensions, the difference in performance between PMOS and NMOS devices becomes smaller since the saturation drift velocity for holes and electrons are not substantially different. Thus, while a preferred embodiment of a memory cell described herein is manufactured using SOI technology, a variety of other semiconductor manufacturing technologies may be used to gain all or many of the benefits of the present invention.

The illustrative SRAM cell described below allows faster read access times than conventional cells. As will be described more fully below, the improvement in read time performance arises, at least in part, by virtue of using one transistor (e.g., an NMOS transistor) to pull down one bit line in a memory array and another transistor (e.g., a PMOS transistor) to pull up another bit line in reading the datum stored in the cell. By using one transistor to pull down one bit line and another transistor to pull up another bit line, a faster differential signal is provided on the bit lines. In known configurations, where the bit lines are charged by resistive loads, the signal is slow by comparison. By combining the illustrative SRAM cell with a "predicted output" sensing arrangement, also described below, the access time in one state can be made essentially zero. The access delay in the other state can be made minimal, as the delay through three stages of sense amplification and output drivers may typically be the delay of only a single gate. The net result is a very fast read access.

Figure 3:
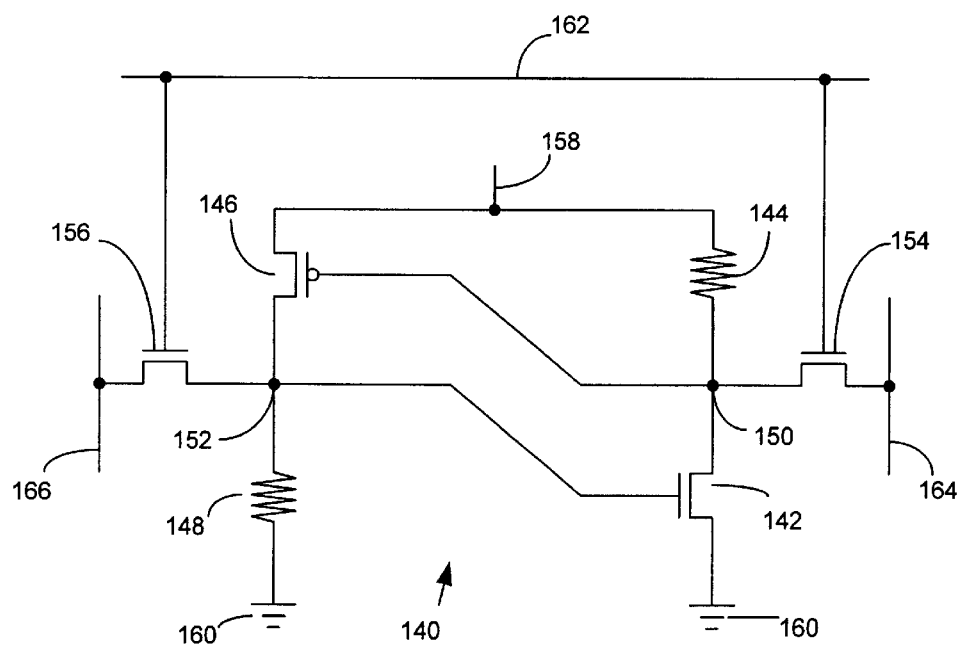
FIG. 3 is a schematic diagram of one illustrative SRAM cell in accordance with the present invention.

FIG. 3 is a schematic diagram of one illustrative SRAM cell 140 embodying the present invention. The cell 140 includes one NMOS transistor 142 and one PMOS transistor 146, as well as two resistors 144, 148. Access transistors 154, 156 enable coupling of the cell 140 to a bit line 164 and a complementary bit line 166. The transistor 142 and the resistor 144 are coupled in series between a first power supply potential 158 and a second power supply potential 160. The transistor 146 and the resistor 148 are coupled in series between the power supply potential 158 and the second power supply potential 160. In the illustrative embodiment of FIG. 3, the first power supply potential 158 is a positive power supply potential 158, and the second power supply potential 160 is an electrical ground potential 160. Throughout the remainder of this description of the illustrative embodiments of the invention, it will be assumed that the first and second power supply potentials 158, 160 are realized as positive and ground potentials, respectively. In other embodiments of the present invention, other power supply potentials may be substituted for the positive potential and ground potential.

A gate terminal of the transistor 142 is coupled to a node 152 between the transistor 146 and the resistor 148. A gate terminal of the transistor 146 is coupled to a node 150 between the transistor 142 and the resistor 144. When in its conducting state, the transistor 142 serves to maintain the voltage at the node 150 at or near the ground potential 160. When in its conducting state, the transistor 146 serves to maintain the voltage at the node 152 at or near the power supply potential 158. When the transistor 142 is in its conducting state, the transistor 142 and the resistor 144 form a DC current path between the power supply potential 158 and the ground potential 160. When the transistor 146 is in its conducting state, the transistor 146 and the resistor 148 form a DC conductive path between the power supply potential 158 and the ground potential 160. When the transistors 142, 146 are in their non-conducting states, no DC current path will exist in the cell 140. When the cell 140 is in either of two stable states, the transistors 142, 146 will either both be conducting or both be non-conducting.

As a person of ordinary skill in the art will appreciate with the benefit of the present disclosure, the cell 140 is capable of storing a datum of information as represented by one of the two possible stable states of the cell 140. In one state, the node 152 will be at or near the ground potential 160 and the node 150 will be at or near the power supply potential 158. In this state, the transistors 142, 146 will both be in their non-conducting states. For purposes of explaining the operation of the cell 140 in FIG. 3, this state will be designated a logical "one." In a second state of the cell 140, the node 152 will be at or near the power supply potential 158, and the node 150 will be at or near the ground potential 160. In this state, the transistors 142, 146 will both be in their conducting states. For purposes of explaining the operation of the cell 140, this state of the cell 140 will be designated as a logical "zero."

Assume first that the cell 140 stores a logical "one" datum. The node 152 will be at or near the ground potential 160, and because the node 152 is coupled to the gate of the transistor 142, the transistor 142 will be in a non-conducting state. In that state, the transistor 142 cannot discharge any potential at the node 150 to the ground potential 160. Also, because the cell 140 is storing a logical "one," the node 150 will be at or near the power supply potential 158. Because the node 150 is coupled to the gate of the PMOS transistor 146, the transistor 146 will be in its non-conducting state as well. In this non-conducting state, the transistor 146 will be prevented from pulling the voltage at the node 152 toward the power supply potential 158. In this logical "one" state, no DC current path exists in the cell 140. With the cell 140 in this logical "one" state, if the cell 140 is to be "read," using the sense amplifier arrangement illustrated in FIG. 1, the bit line 164 and the complementary bit line 166 will each be pre-charged to a value of approximately one-half the power supply potential. An access signal will be provided on the line 162 to enable the access transistors 154 and 156 to couple the cell 140 to the bit line 164 and the complementary bit line 166, respectively. At that time, because the transistor 142 is non-conducting, or essentially non-conducting, the node 150, and thus the bit line 164, will be pulled toward the power supply potential 158 through the resistor 144. At the same time, because the transistor 146 is non-conducting, or essentially non-conducting, the potential at the node 152, and thus the potential on the complementary bit line 166, will be pulled toward the ground potential 160 through the resistor 148. In this manner, a differential voltage will appear between the bit line 164 and the complementary bit line 166. That differential will then be amplified by way of a sense amplifier, such as, for example, the sense amplifier 20 illustrated in FIG. 1.

Assume now that the cell 140 in FIG. 3 stores a logical "zero." In that state, the node 152 will be at or near the power supply potential 158, and the node 150 will be at or near the ground potential 160. The transistor 142 will be in its conducting state, maintaining the potential at the node 150 at or near the ground potential 160. The transistor 146 will also be in its conducting state, maintaining the voltage at the node 152 at or near the power supply potential 158. In this state, two parallel DC current paths will exist in the cell, the first through the transistor 142 and the resistor 144, and the second through the transistor 146 and the resistor 148. The resistors 144 and 148 may be sized so as to minimize the magnitude of DC current flowing through the cell, while at the same time not unduly restricting current flow, which will be needed when a logical "one" state is read from the cell as described above.

In certain configurations and under certain conditions, the cell 140 may be sensitive to leakage currents, noise and upset. If the NMOS transistor 142 is "off," then the node 150 may be sensitive to leakage current or noise, causing the potential on the node 150 to decrease and thereby allowing the PMOS transistor 146 to possibly turn "on." If the PMOS transistor 146 becomes active and the loop gain is larger than one, then the cell 140 can be "upset" or caused to switch states, resulting in a data error. Larger values of the resistor 144 make the cell 140 more sensitive to being upset. Likewise, if the PMOS transistor 146 is "off," the node 152 may be sensitive to noise and sub-threshold leakage, causing the voltage at the node 152 to increase, and thereby allowing the NMOS transistor 142 to possibly turn "on." If the NMOS transistor 142 turns "on" and if the loop gain becomes larger than one, the cell 140 can be upset. If the NMOS transistor 142 and the PMOS transistor 146 are "on" (e.g., if the cell 140 is storing a logical "zero"), they are in a low resistance state, and the cell 140 is insensitive to being upset.

Larger and larger values of the resistors 144, 148 make the cell 140 more sensitive to being upset. However, larger load resistors 144, 148 result in less power dissipation. Where the power supply potential 158 is 2.5 VDC, if the potential at the node 150 decreases below about 0.8 VDC, the gain will become larger than one and the cell 140 will be upset. Likewise, if the node 152 increases above about 0.2 VDC due to noise or sub-threshold leakage, the cell 140 can be upset. In one embodiment, selecting the resistors 144, 148 to be in the range of approximately 100k ohms–200k ohms adequately minimizes power dissipation while achieving satisfactory cell stability. Other resistor sizes may also be satisfactory, or indeed may be more desirable, in cells having various differing characteristics and/or configurations, or in circumstances involving different power supply voltages. A primary objective in sizing the resistors 144, 148 is the trade-off between cell stability and power dissipation and the optimization of that trade-off.

Continuing with FIG. 3, when the logical "zero" state of the cell 140 is to be read using, for example, the sense amplifier 20 illustrated in FIG. 1, the bit line 164 and the complementary bit line 166 will each be pre-charged to a potential of approximately one-half the power supply potential 158. At that time, an access signal will be provided on the line 162, enabling the access transistors 154 and 156 to couple the cell 140 to the bit line 164 and the complementary bit line 166, respectively. When the cell 140 has been thus coupled, the transistor 142, because it is in its conducting state, will begin to pull the voltage level on the bit line 164 toward the ground potential 160. At the same time, because the transistor 146 is also in its conducting state, the voltage on the complementary bit line 166 will be pulled toward the power supply potential 158. A potential difference will appear between the bit line 164 and the complementary bit line 166, and that differential will again be magnified by way of, for example, a sense amplifier such as the sense amplifier 20 illustrated in FIG. 1.

Figure 4:
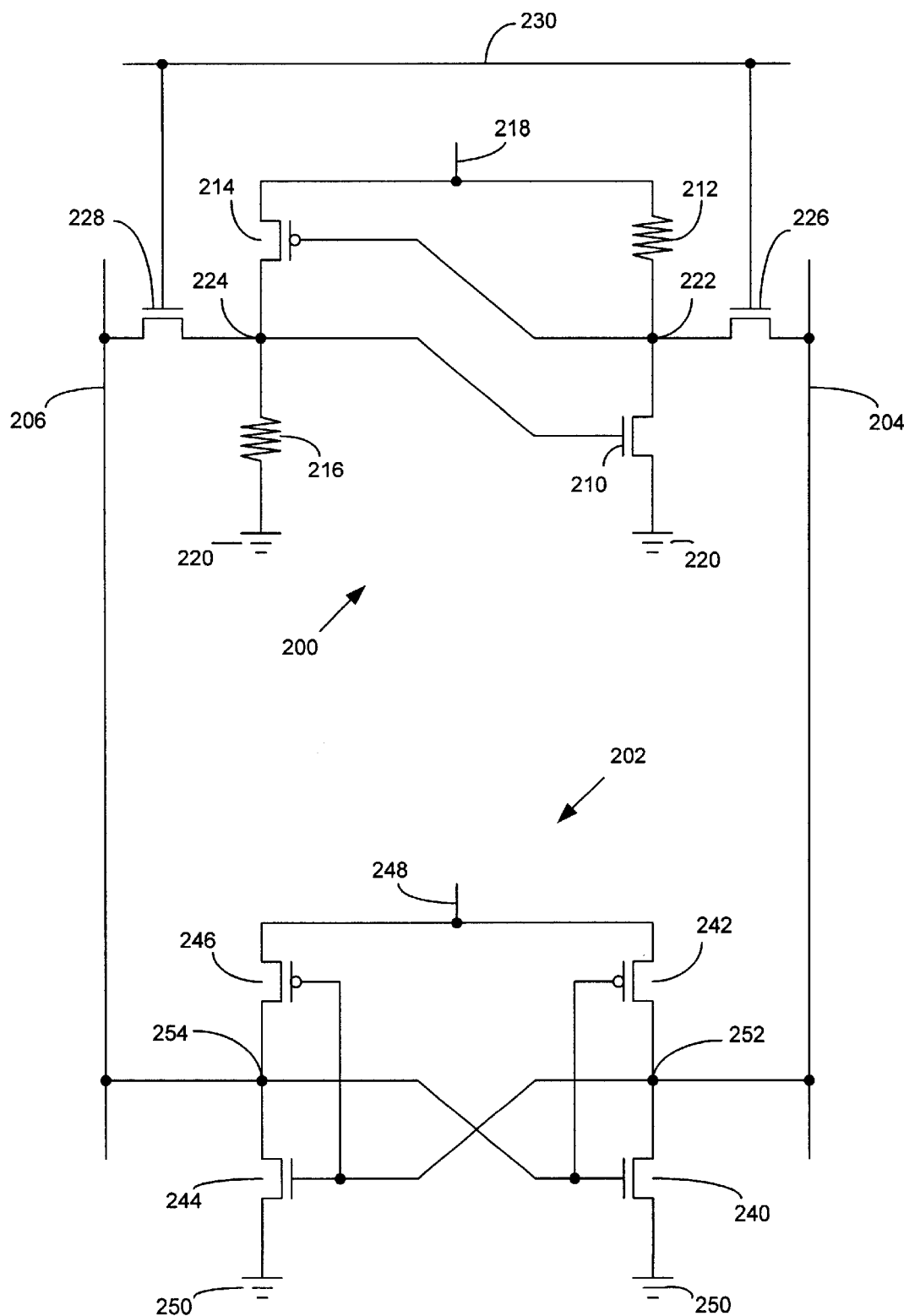
FIG. 4 is a schematic diagram of one illustrative SRAM cell, utilizing aspects of the present invention, combined with a conventional cross-coupled sense amplifier.

To further explain the operation of one illustrative example of the inventive memory cell, FIG. 4 illustrates one particular SRAM cell 200 essentially identical to the SRAM cell 140 of FIG. 3 in combination with a sense amplifier 202. The cell 200 is coupled to the sense amplifier 202 by way of a bit line 204 and a complementary bit line 206. The cell 200 includes an NMOS transistor 210 coupled in series with a resistor 212 between a power supply potential 218 and a ground potential 220. The cell 200 also includes a PMOS transistor 214 coupled in series with a resistor 216 between the power supply potential 218 and the ground potential 220. A gate of the NMOS transistor 210 is coupled to a node 224 between the transistor 214 and the resistor 216, while a gate of the PMOS transistor 214 is coupled to a node 222 between the transistor 210 and the resistor 212. The node 222 may be coupled to the bit line 204 by way of an access transistor 226 when an access enable signal is provided at the line 230. The node 224 may be coupled to the complementary bit line 206 by way of an access transistor 228 when the access enable signal is provided at the line 230. The storing of a logical "zero" or logical "one" datum in the cell 200 was explained above in conjunction with the cell 140 in FIG. 3.

The sense amplifier 202 in FIG. 4 includes an NMOS transistor 240 and a PMOS transistor 242 coupled in series between a power supply potential 248 and a ground potential 250. The sense amplifier 202 also includes an NMOS transistor 244 and a PMOS transistor 246 coupled in series between the power supply potential 248 and the ground potential 250. A gate of the NMOS transistor 240 is coupled to a gate of the PMOS transistor 242, and the gates of the transistors 240 and 242 are coupled to a node 254 between the transistor 244 and the transistor 246. A gate of the NMOS transistor 244 is coupled to a gate of the PMOS transistor 246, and the gates of the transistors 244 and 246 are coupled to a node 252 between the transistor 240 and the transistor 242.

In reading a datum from the cell 200, the bit line 204 and complementary bit line 206 may each be pre-charged to a value of VDD/2, or approximately one-half the power supply potential. Thereafter, the sense amplifier 202 may magnify a potential differences induced on the bit line 204 and complementary bit line 206 by the action of the cell 200. Because the cell 200 is asymmetrical, the response time for the sensing operation depends on which of the two stable states exists in the cell 200. When the transistors 210 214 are non-conducting, the resistor 212 will attempt to pull the bit line 204 up while the resistor 216 will attempt to pull the complementary bit line down. This situation (as compared to the transistors 210, 214 in their conducting states) provides the slower read response. For example, when the resistors 210, 214 are each about 100 k ohms, and when the cell 200 is used in conjunction with the conventional sense amplifier 202 of FIG. 4, approximately 2.0 nanoseconds is required for a 0.25 volt change in the output of the sense amplifier 202.

FIGS. 5A–5D are schematic diagrams of one illustrative sense amplifier and output circuitry embodying aspects of the present invention. The configuration and operation of the particular sense amplifier and output circuitry of FIGS.

5A–5D provides significantly shorter read access times than provided by conventional devices. In one embodiment, the cell 140 of FIG. 3 may be combined with the sense amplifier 300 and output circuitry 302, 304, 306 of FIGS. 5A–5D to provide read access times as much as three times faster than combinations of conventional cells and circuitry.

Referring to FIGS. 5A–5D, the sense amplifier 300 is coupled to a bit line 338 and a complementary bit line 340 and provides outputs X and X'. The signals X and X' are both coupled to each of the driver amplifiers 302 and 304. The signal X is coupled to a gate of the transistor 342 in the driver amplifier 302 and to a gate of the transistor 380 in the driver amplifier 304. The signal X' is coupled to a gate of the transistor 348 in the driver amplifier 302 and to a gate of the transistor 374 in the driver amplifier 304. The driver amplifiers 302 and 304 produce signals Y and Y', respectively. The signals Y and Y' are coupled as input signals to the output driver 306.

The sense amplifier 300 includes an NMOS transistor 314 coupled in series with a PMOS transistor 316 between a power supply potential 318 and a node 320 in the sense amplifier 300. An NMOS transistor 310 is coupled in series with a PMOS transistor 312 between the power supply potential 318 and the node 320. A PMOS transistor 328 is coupled in parallel to the PMOS transistor 312, that is, the PMOS transistor 328 is coupled between the power supply potential 318 and a node 334 between the transistors 310 and 312. The gates of the PMOS transistors 316 and 312 are coupled together, and together are coupled to a ground potential 332. Thus, the PMOS transistors 312 and 316 are maintained in their conducting states. The PMOS transistor 328 is biased at its gate by a clock signal phi1 on the line 330, as will be more fully explained below. The PMOS transistor 328 will provide a pre-charge function, enabling the pre-charge of the node 334 to a high potential. The node 320 in the sense amplifier 300 is coupled to a ground potential 324 through an NMOS transistor 322 that is biased at its gate by the clock signal phi1 on the line 326. A bit line 338 is coupled to the gate of the NMOS transistor 310, while a complementary bit line 340 is coupled to the gate terminal of the NMOS transistor 314. Through an operation of the sense amplifier 300, the signal X will be provided at the node 334, and the signal X' will be provided at the node 336.

The driver amplifier 302 includes an NMOS transistor 348 coupled in series with a PMOS transistor 346 between a power supply potential 358 and a node 360. An NMOS transistor 342 is coupled in series with a PMOS transistor 344 between the power supply potential 358 and the node 360. A PMOS transistor 354 is coupled in parallel with the PMOS transistor 344, that is, the PMOS transistor 354 is coupled between the power supply potential 358 and a node 352 between the transistors 342 and 344. The gate terminals of the PMOS transistors 344 and 346 are coupled together, and together they are coupled to a node 350 between the transistors 346 and 348. The gate of the PMOS transistor 354 is biased by a clock signal phi2 on the line 356. The node 360 is coupled to a ground potential 364 through an NMOS transistor 362 which is biased at its gate by the clock signal phi2 on the line 366. The gate of the transistor 342 is coupled at line 368 to receive the signal X from the sense amplifier 300. The gate of the transistor 348 is coupled at line 370 to receive the signal X' from the sense amplifier 300. The driver amplifier 302 provides an output signal Y at the node 352 on line 372. The clock signal phi2 lags the clock signal phi1 by an amount of time sufficient for the sense amplifier 300 to provide valid signals X and X' to the driver amplifier 302.

The driver amplifier 304 includes an NMOS transistor 380 coupled in series with a PMOS transistor 378 between a power supply potential 390 and a node 392. An NMOS transistor 374 is coupled in series with a PMOS transistor 376 between the power supply potential 390 and the node 392. A PMOS transistor 386 is coupled in parallel with the PMOS transistor 376, that is, the PMOS transistor 386 is coupled between the power supply potential 390 and a node 384 between the transistors 374 and 376. The gate terminals of the PMOS transistors 376 and 378 are coupled together, and together they are coupled to a node 382 between the transistors 378 and 380. The gate of the PMOS transistor 386 is biased by the clock signal phi2 on the line 388. The node 392 is coupled to a ground potential 396 through an NMOS transistor 394 which is biased at its gate by the clock signal phi2 on the line 398. The gate of the transistor 374 is coupled at line 400 to receive the signal X' from the sense amplifier 300. The gate of the transistor 380 is coupled at line 402 to receive the signal X from the sense amplifier 300. The driver amplifier 304 provides an output a signal Y' at the node 384 on line 404.

The output driver 306 includes an NMOS transistor 412 coupled in series with a PMOS transistor 410 between a power supply potential 422 and a node 424. An NMOS transistor 406 is coupled in series with a PMOS transistor 408 between the power supply potential 422 and the node 424. A PMOS transistor 418 is coupled in parallel with the PMOS transistor 408, that is, the PMOS transistor 418 is coupled between the power supply potential 422 and a node 416 between the transistors 406 and 408. The gate terminals of the PMOS transistors 408 and 410 are coupled together, and together they are coupled to a node 414 between the transistors 410 and 412. The gate of the PMOS transistor 418 is biased by a clock signal phi3 on the line 420. The node 424 is coupled to a ground potential 428 through an NMOS transistor 426 which is biased at its gate by the clock signal phi3 on the line 430. The gate of the transistor 406 is coupled at line 432 to receive the signal Y from the driver amplifier 302. The gate of the transistor 412 is coupled at line 434 to receive the signal Y' from the driver amplifier 304. The output driver 306 provides an output signal OUTPUT at the node 416 on line 436. The clock signal phi3 lags the clock signal phi2 by an amount of time sufficient for the driver amplifiers 302, 304 to provide valid signals Y and Y' to the output driver 306.

Figure 6:
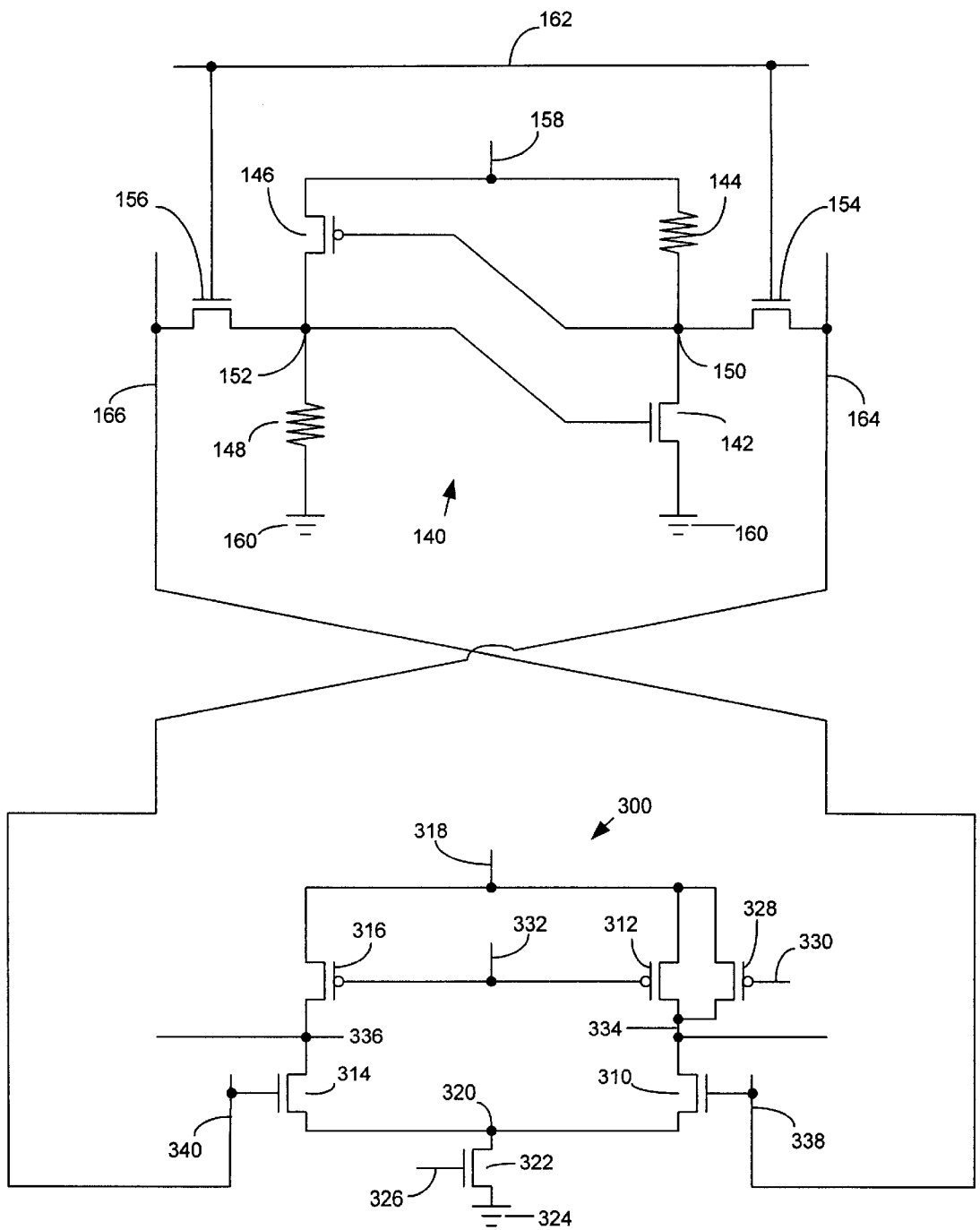
FIG. 6 is a schematic diagram illustrating a combination of the SRAM cell 140 of FIG. 3 and the sense amplifier 300 of FIG. 5A.

FIG. 6 is a schematic diagram illustrating a combination of the SRAM cell 140 of FIG. 3 and the sense amplifier 300 of FIG. 5A. In this combination, the bit line 164 of FIG. 3 corresponds to the bit line 340 of FIG. 5A, and the complementary bit line 166 of FIG. 3 corresponds to the complementary bit line 338 of FIG. 5A. As already mentioned, the SRAM cell 140 is asymmetrical, and the read response time for the cell 140 is slower when the cell 140 stores a logical "one" datum than when the cell 140 stores a logical "zero" datum. The logical "one" state of the cell 140 represents that state in which both of the transistors 142, 146 are non-conducting. The node 150 is at a high potential, and the node 152 is at a low potential. The logical "zero" state of the cell 140 represents that state in which both of the transistors 142, 146 are conducting. The node 150 is at a low potential, and the node 152 is at a high potential. When the cell 140 is to be coupled to the sense amplifier 300 for sensing the state of the cell 140, the bit line 164 will be pre-charged to a high potential, and the complementary bit line 166 will be pre-charged to a low potential (essentially ground potential). In other words, the bit line 164 and the complementary bit line 166 are pre-charged to a state that would be the result obtained in the event a logical "one" is stored in the cell 140. That is, the output will be predicted to be a logical "one." When the cell 140 is coupled to the pre-charged bit line 164 and complementary bit line 166, if a logical "one" is stored in the cell 140, no charging of the bit line 164 through the resistor 144 or discharging of the complementary bit line 166 through the resistor 148 will be necessary. If a logical "zero" is stored in the cell 140, the bit line 164 will be discharged through the transistor 142, and the complementary bit line 166 will be charged through the transistor 146.

The time required to discharge and charge, respectively, the capacitive loads of the bit line 164 and complementary bit line 166 through the transistors 142, 146 is much less than the time required to charge and discharge, respectively, the bit line 164 and the complementary bit line 166 through the resistors 144 and 148. Moreover, switching transients on resistive load inverters are wildly asymmetrical. The transient where the active transistor is discharging the capacitive load is almost an order of magnitude shorter in time than the transient where the load resistor charges the capacitive load. As a result of the fully differential signal and faster charging transients when the transistors 142 and 146 are both conducting in the SRAM cell 140, the output of the sense amplifier 300 takes only about 1.0 nanoseconds to change by 0.25 volts. This is about three times faster than that for the conventional SRAM cell read sense operation. Thus, combining the SRAM cell 140 with the "predicted output" sense amplifier 300 with clocked sense amplifiers results in very fast read access times.

In a typical collection of memory cells, on average, only one-half the cells will store a logical "zero." Thus, in a collection of SRAM cells such as the cell 140, on average, only one-half the cells will conduct DC current. On average, one-half the time, the transistors 142, 146 will both be non-conducting and the resistive loads 144, 148 will maintain one output high and the other output low. The resistive loads 144, 148 serve only to maintain one of the output nodes 150 of the cell 140 high and the other output node 152 of the cell 140 low when both of the transistors 142, 146 are non-conducting. When the access transistors 154, 156 couple the cell 140 to the lines 164, 166 when both transistors 142, 146 are non-conducting, there will be no change in the state of the lines 164, 166. Thus, the resistors 144, 148 play no role in charging or discharging the lines 164, 166 during sensing. On the other hand, the transistors 142, 146 can quickly discharge and charge, respectively, the lines 164, 166.

In the sense amplifier 300, as well as in the driver amplifiers 302, 304 and output driver 306 (see FIGS. 5A–5D), the slowest transition is from low to high, where the PMOS transistor 312, 344, 376 or 408 charges up the output node 334, 352, 384 or 416, respectively. Accordingly, the output nodes are all preferably pre-charged high, and the only transition possible in the sense amplifier 300, driver amplifiers 302, 304 or output driver 306 is the faster high-to-low transition. If a "one" is stored in the cell 140, then during sensing and during clocking of the amplifiers, only the output node 352 of the driver amplifier 302 (see FIG. 5B) must change state, from high to low. Also, because of the gain of the amplifiers, the output node 352 of the driver amplifier 302 need not be pulled completely low before its output signal is valid. The output signal will be valid shortly after the clock signal phi2 goes high and essentially valid when the clock signal phi3 goes high. If a "zero" is stored in the cell 140, then during sensing and clocking, the output nodes 334 and 404 of the amplifiers 300 and 304 and the output node 416 of the amplifier 306 go low.

Under this sense amplifier and output circuitry arrangement, all changes in state are from high to low. No low-to-high transitions, which are the slower transitions, are required in the chain of amplifiers. Therefore, in the chain of amplifiers, the clocks can be separated by only a fraction of the propagation delay of a single stage. In other words, the output data in this case will be valid after the propagation delay of a single stage.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A memory cell, comprising:

first and second output nodes;

a first transistor coupled between a first power supply node and the first output node;

a first load coupled between the first output node and a second power supply node;

a second load coupled between the first power supply node and the second output node; and a second transistor coupled between the second output node and the second power supply node, a gate terminal of the first transistor being coupled to the second output node, and a gate terminal of the second transistor being coupled to the first output node.

2. The memory cell of claim 1, wherein the first and second loads comprise first and second resistors.

3. The memory cell of claim 2, wherein the first and second resistors comprise first and second resistors each having a value between approximately 100k ohms and approximately 200k ohms.

4. The memory cell of claim 1, further comprising:

a first access transistor coupled between the first output node and a first bit line; and a second access transistor coupled between the second output node and a second bit line, the first and second access transistors each comprising a gate terminal coupled to an access signal line, the first and second access transistors adapted to couple the first and second output nodes to the first and second bit lines, respectively, in response to an access signal on the access signal line.

5. The memory cell of claim 4, wherein the first and second loads comprise first and second resistors.

6. The memory cell of claim 5, wherein the first and second resistors comprise first and second resistors each having a value between approximately 100k ohms and approximately 200 k ohms.

7. The memory cell of claim 1, wherein the first transistor comprises a p-channel transistor and the second transistor comprises an n-channel transistor.

8. The memory cell of claim 7, wherein the first and second loads comprise first and second resistors.

9. The memory cell of claim 8, wherein the first and second resistors comprise first and second resistors each having a value between approximately 100 k ohms and approximately 200 k ohms.

10. The memory cell of claim 7, wherein the first power supply node comprises a positive power supply node and the second power supply node comprises a power supply electrical ground node.

11. The memory cell of claim 1, wherein the first power supply node comprises a positive power supply node and the second power supply node comprises a power supply electrical ground node.

12. The memory cell of claim 11, wherein the first and second loads comprise first and second resistors.

13. The memory cell of claim 12, wherein the first and second resistors comprise first and second resistors each having a value between approximately 100 k ohms and approximately 200 k ohms.

14. A sense amplifier, comprising:
first and second output nodes;
a first transistor coupled between a first power supply node and the first output node;
a second transistor coupled between the first output node and a second power supply node, the second transistor having a gate terminal coupled to a first bit line;
a third transistor coupled between the first power supply node and the second output node;
a fourth transistor coupled between the first power supply node and the second output node, the fourth transistor having a gate terminal coupled to a clock signal line; and
a fifth transistor coupled between the second output node and the second power supply node, the fifth transistor having a gate terminal coupled to a second bit line,
the sense amplifier adapted to provide first and second output signals at the first and second output nodes, respectively, in response to signals on the first and second bit lines and a clock signal on the clock signal line.

15. The sense amplifier of claim 14, further comprising a sixth transistor coupled between the second transistor and the second power supply node, the sixth transistor also being coupled between the first transistor and the second power supply node, the sixth transistor having a gate terminal coupled to the clock signal line.

16. The sense amplifier of claim 15, wherein the first, third and fourth transistors each comprise a p-channel transistor, and wherein the first and third transistors each have a gate terminal coupled to the second power supply node.

17. The sense amplifier of claim 16, wherein the first power supply node comprises a positive power supply node and the second power supply node comprises a power supply electrical ground node.

18. The sense amplifier of claim 14, wherein the first, third and fourth transistors each comprise a p-channel transistor, and wherein the first and third transistors each have a gate terminal coupled to the second power supply node.

19. The sense amplifier of claim 18, wherein the first power supply node comprises a positive power supply node and the second power supply node comprises a power supply electrical ground node.

20. A sense amplifier, comprising:
first and second output nodes;
a first load coupled between a first power supply node and the first output node;
a second load coupled between the first power supply node and the second output node;
a first input transistor coupled between the first output node and a second power supply node, the first input transistor having a gate terminal coupled to a first bit line;
a second input transistor coupled between the second output node and the second power supply node, the second input transistor having a gate terminal coupled to a second bit line; and
a pre-charge transistor coupled between the first power supply node and the second output node, the pre-charge transistor having a gate terminal coupled to a clock signal line, the pre-charge transistor adapted to couple the second output node to the first power supply node during a first phase of a clock signal on the clock signal line.

21. The sense amplifier of claim 20, further comprising:
an activating transistor coupled between the first input transistor and the second power supply node and coupled between the second input transistor and the second power supply node, the activating transistor having a gate terminal coupled to the clock signal line,
the activating transistor adapted to couple the first and second input transistors to the second power supply node during a second phase of the clock signal on the clock signal line.

22. The sense amplifier of claim 21, wherein the first and second loads comprise first and second p-channel transistors, each of the first and second p-channel transistors having a gate terminal coupled to the second power supply node.

23. The sense amplifier of claim 22, wherein the first power supply node is a positive power supply node and the second power supply node comprises a power supply electrical ground node.

24. The sense amplifier of claim 20, wherein the first and second loads comprise first and second p-channel transistors, each of the first and second p-channel transistors having a gate terminal coupled to the second power supply node.

25. The sense amplifier of claim 23, wherein the first power supply node comprises a positive power supply node and the second power supply node comprises a power supply electrical ground node.

26. The sense amplifier of claim 20, wherein the first power supply node comprises a positive power supply node and the second power supply node comprises a power supply electrical ground node.

27. A memory cell sense circuit, comprising:
a sense amplifier, having:
first and second sense amplifier output nodes;
a sense amplifier pre-charge transistor coupled between a first power supply node and the second sense amplifier output node, the pre-charge transistor having a gate terminal coupled to a clock signal line, the pre-charge transistor adapted to couple the second sense amplifier output node to the first power supply node during a first phase of a first clock signal on the clock signal line;
a first input transistor coupled between the first sense amplifier output node and a sense amplifier activating node, the first input transistor having a gate terminal coupled to a first bit line;
a second input transistor coupled between the second sense amplifier output node and the sense amplifier activating node, the second input transistor having a gate terminal coupled to a second bit line; and
a sense amplifier activating transistor coupled between the second amplifier activating node and a second power supply node, the sense amplifier activating transistor having a gate terminal coupled to the clock signal line and adapted to couple the first and second input transistors to the second power supply node during a second phase of the first clock signal on the clock signal line;

a first driver circuit, having:
  a first driver output node;
  a first driver pre-charge transistor coupled between the first power supply node and the first driver output node, the first driver pre-charge transistor having a gate terminal coupled to the clock signal line and adapted to couple the first driver output node to the first power supply node during a first phase of a second clock signal on the clock signal line;
  a first input transistor coupled between the first power supply node and a first driver activating node, the first input transistor of the first driver having a gate terminal coupled to the first sense amplifier output node;
  a second input transistor coupled between the first driver output node and the first driver activating node, the second input transistor of the first driver having a gate terminal coupled to the second sense amplifier output node; and
  a first driver activating transistor coupled between the first driver activating node and the second power supply node, the first driver activating transistor having a gate terminal coupled to the clock signal line and adapted to couple the first and second input transistors of the first driver to the second power supply node during a second phase of the second clock signal in the clock signal line;

a second driver circuit, having,
  a second driver output node;
  a second driver pre-charge transistor coupled between the first power supply node and the second driver output node, the second driver pre-charge transistor having a gate terminal coupled to the clock signal line and adapted to couple the second driver output node to the first power supply node during a first phase of the second clock signal on the clock signal line;
  a first input transistor coupled between the first power supply node and a second driver activating node, the first input transistor of the second driver having a gate terminal coupled to the second sense amplifier output node;
  a second input transistor coupled between the second driver output node and the second driver activating node, the second input transistor of the second driver having a gate terminal coupled to the first sense amplifier output node; and
  a second driver activating transistor coupled between the second driver activating node and the second power supply node, the second driver activating transistor having a gate terminal coupled to the clock signal line and adapted to couple the first and second input transistors of the second driver to the second power supply node during a second phase of the second clock signal on the clock signal line; and a driver output circuit, having:
  a driver circuit output node;
  a driver circuit pre-charge transistor coupled between the first power supply node and the driver circuit output node, the driver circuit pre-charge transistor having a gate terminal coupled to the clock signal line and adapted to couple the driver circuit output node to the first power supply node during a first phase of a third clock signal on the clock signal line;
  a first input transistor coupled between the first power supply node and a driver circuit activating node, the first input transistor of the driver circuit having a gate terminal coupled to the second driver output node;
  a second input transistor coupled between the driver circuit output node and the driver circuit activating node, the second input transistor of the driver circuit having a gate terminal coupled to the first driver output node; and
  a driver circuit activating transistor coupled between the driver circuit activating node and the second power supply node, the driver circuit activating transistor having a gate terminal coupled to the clock signal line and adapted to couple the first and second input transistors of the driver circuit to the second power supply node during a second phase of the third clock signal on the clock signal line.

28. A memory cell sense circuit, comprising:
a sense amplifier coupled to first and second bit lines and having first and second sense amplifier output nodes;
a first driver circuit coupled to the first and second sense amplifier output nodes and having a first driver output node;
a second driver circuit coupled to the first and second sense amplifier output nodes and having a second driver output node; and
an output driver circuit coupled to the first and second driver output nodes and having an output driver output node,
the sense amplifier having a pre-charge transistor coupled to the second sense amplifier output node and adapted to pre-charge the second sense amplifier output node to approximately a first power supply potential, and
each of the first driver circuit, the second driver circuit and the output driver circuit having a pre-charge transistor coupled to its respective output node and adapted to pre-charge its respective output node to approximately the first power supply potential.

* * * * *